United States Patent
Hu et al.

(10) Patent No.: US 9,122,169 B2
(45) Date of Patent: Sep. 1, 2015

(54) MASK LAYOUT PATTERNS FOR CLOSELY SPACED PRIMITIVES IN PHASE SHIFT PHOTOLITHOGRAPHY MASKS

(75) Inventors: Bin Hu, Portland, OR (US); Vivek K. Singh, Portland, OR (US); Sungwon Kim, Portland, OR (US); Chulwoo Oh, Hillsboro, OR (US); Mehmet E. Yavuz, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/977,638

(22) PCT Filed: Dec. 29, 2011

(86) PCT No.: PCT/US2011/067978
§ 371 (c)(1),
(2), (4) Date: May 9, 2014

(87) PCT Pub. No.: WO2013/101129
PCT Pub. Date: Jul. 4, 2013

(65) Prior Publication Data
US 2014/0302427 A1    Oct. 9, 2014

(51) Int. Cl.
G06F 17/50     (2006.01)
G03F 1/68      (2012.01)
G03F 1/26      (2012.01)
G03F 1/70      (2012.01)

(52) U.S. Cl.
CPC .. G03F 1/68 (2013.01); G03F 1/26 (2013.01); G03F 1/70 (2013.01)

(58) Field of Classification Search
CPC .......................................................... G03F 1/68
USPC ................................................. 716/50, 51, 54
See application file for complete search history.

(56) References Cited

U.S. PATENT DOCUMENTS

| | | | |
|---|---|---|---|
| 6,994,939 B1* | 2/2006 | Ghandehari et al. | 430/5 |
| 7,401,319 B2* | 7/2008 | Horng et al. | 716/53 |
| 7,698,676 B1* | 4/2010 | Qian | 716/119 |
| 2006/0225024 A1 | 10/2006 | Hu et al. | |
| 2007/0226674 A1 | 9/2007 | Haffner et al. | |
| 2008/0145769 A1 | 6/2008 | Kawakami | |
| 2014/0195994 A1* | 7/2014 | Swanson et al. | 716/55 |

OTHER PUBLICATIONS

Konstantinos Adam & Andrew R. Neureuther; "Domain decomposition methods for the rapid electromagnetic simulation of photomask scattering"; JM3 1(3) 253-269 (Oct. 2002); J. Microlith., Microfab., Microsyst., vol. 1 No. 3, Oct. 2002.
PCT Search Report, PCT/US2011/067978, Intel Corporation, Sep. 27, 012, 11 pages.

* cited by examiner

*Primary Examiner* — Sun Lin
(74) *Attorney, Agent, or Firm* — Blakely, Sokoloff, Taylor & Zafman LLP

(57) ABSTRACT

Improved mask layout patterns are described for closely spaced primitives in phase shift photolithography masks. In one example, at least a portion of a photolithography mask layout is decomposed into primitives. Jogs are identified from among the primitives, the jogs being characterized by three adjacent corners. E-fields are determined for the identified jogs and are applied to synthesize an electric field at a substrate. The mask layout is corrected using the synthesized electric field and a printed wafer pattern is calculated.

20 Claims, 3 Drawing Sheets

MASK LAYOUT PATTERNS FOR CLOSELY SPACED PRIMITIVES IN PHASE SHIFT PHOTOLITHOGRAPHY MASKS

CROSS-REFERENCE TO RELATED APPLICATION

This patent application is a U.S. National Phase Application under 35 U.S.C. §371 of International Application No. PCT/US2011/067978, filed Dec. 29, 2011, entitled "IMPROVED MASK LAYOUT PATTERNS FOR CLOSELY SPACED PRIMITIVES IN PHASE SHIFT PHOTOLITHOGRAPHY MASKS".

TECHNICAL FIELD

The present description relates to the field of mask pattern layout for photolithography and, in particular, to improving mask layout patterns by factoring E-field calculations for determining phase shift masks.

BACKGROUND

Electronic and micromechanical devices are formed by patterning successive layers on a substrate using lithography. The patterns are formed by applying a layer of photoresist to a surface. Light is then passed through a patterned imaging plate, such as a mask or reticle, to expose the photoresist in patterns that correspond to the desired features on the substrate. A developer is applied and the photoresist is etched away leaving only the features in a pattern corresponding to the pattern on the mask. As the size of the features, such as parts of transistors, decreases, there are more features on the same size mask and the mask designs becomes more complex.

For very small features, phase shift technology (referred to as phase shift masks) is used. In a conventional non-phase shift mask, the light transmitted through adjacent transparent areas of the mask is in phase and the features are large enough that the phase of the light does not significantly affect the amount of light that hits the photoresist. Each transparent area on the mask results in a corresponding exposed area on the photoresist. With very small features, that is when the dimensions of the features are close to the wavelength of the light, diffraction occurs as the light passes through the mask. The light passing through adjacent transparent areas will interfere constructively or destructively, so that in some places on the photoresist the amplitude of the light adds together and on some places of the photoresist that light will cancel itself out. The resulting pattern on the photoresist ends up different from the pattern on the mask.

In a phase shift mask, light transmitted through adjacent features is phase shifted by the mask so that constructive and destructive interference is intentionally used to form the pattern on the photoresist. The mask is a grid of pixels that either block light, transmit light, or transmit light with a phase shift. The intentional use of optical interference gives greater control over the creation of small features. However it makes mask design more complex.

Masks are designed using computer software. For complex mask designs (e.g., the designs of phase shift masks for sub-wavelength features), accurate mask design software is very complex and the calculations may be very slow. As a result, approximations and simplifications are used to estimate the pattern that will be created by a particular mask. The thin mask method uses geometrical optics to calculate the electric field transmitted by light passing through the mask onto the photoresist. The thin mask method ignores light scattering effects due to the shape of particular mask features. There is more than one approach to effectively add thick mask effects to the thin mask method. A boundary layer method modifies the thin mask field in feature edge areas (the so-called boundary layer) to account for some scattering effects. The edge domain decomposition method adds edge scattering corrections to the thin mask field to improve the accuracy. Other methods are also used.

However, actual masks are not thin. Accurately accounting for the effects of the thickness of the mask becomes more important as features become smaller and can allow the mask design to be corrected for increasingly strong scattering effects and aggressive illumination schemes.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the present invention allow for the patterning of sub-wavelength features in chromeless phase shift masks. Higher order correction effects are included. This accounts for strong scattering effects of smaller structures including coupling effects from neighboring features. Embodiments of the invention may be extended to include interactions between edges, corners, jogs, notches and other features.

A typical mask layout has a collection of sub-wavelength features, i.e. features that are smaller than the wavelength of the light used to perform photolithography. The features may be decomposed into geometry entities or primitives such as edges, spaces, corners, and jogs or notches. For each primitive, the scattered electric fields of the photolithography light are calculated using a rigorous simulator and then stored for later use.

The scattered field calculation may be made by first applying previously calculated scattered fields for each primitive. A filtering scheme may then be applied for scattered fields from the jogs or notches. The filtered scattered field may then be used to calculate the printed wafer pattern. This process may be repeated until the printed wafer pattern matches with the target pattern within any particular predefined criteria.

Figure 1:
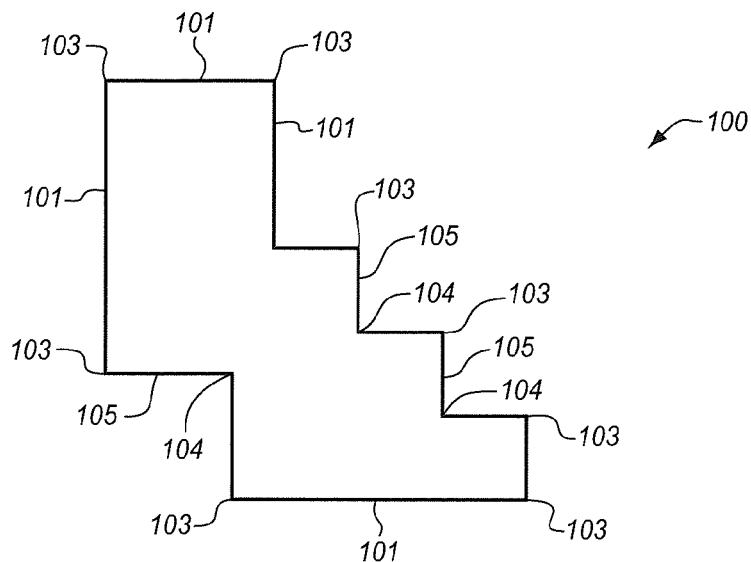
FIG. 1 is diagram of a feature of a photolithography mask having jog primitives according to an embodiment of the invention.

FIG. 1 shows an example of jog and notch primitives that may be patterned better using techniques described below. The feature 100 is used as an illustration of some shapes that may occur in a photolithography mask layout. The illustrated feature does not correspond to any particular semiconductor or micromechanical structure but has been selected to show primitives to which the present invention may be applied. The described techniques may be applied to actual mask features in the same way as they are applied to the illustrated feature. The feature may originate as part of an idealized original mask design or may be developed after applying a variety of other processes to the mask layout. The feature includes edges 101, outside corners 103, inside corners 104, and jogs or notches 105. In the illustrated features there are three jog primitives 105 characterized in this example by an inside corner adjacent to an outside corner on either side of the inside corner.

Figure 2:
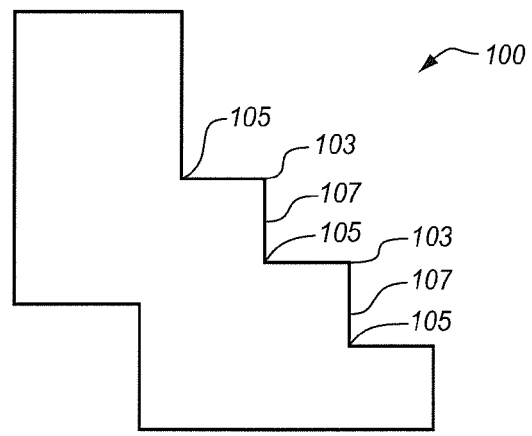
FIG. 2 is diagram of the photolithography mask feature of FIG. 1 showing jog primitives according to an alternative embodiment of the invention.

FIG. 2 shows the same feature 100, however, in this case the jogs are reversed. The jog primitives 107 of FIG. 2 are characterized by having an outside corner 103 adjacent to an inside corner on either side of the outside corner. Viewed in this way the feature 100 has two jogs, not three. The other outside corners do not have an adjacent inside corner on either side. Whether the center corner is an inside corner or an outside corner, a similar approach can be taken to characterize the electric fields of a jog primitive.

Figure 3:
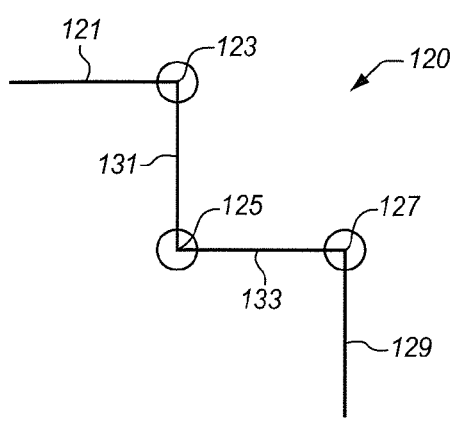
FIG. 3 is diagram of a single jog primitive of the photolithography of FIG. 1 according to an embodiment of the invention.

FIG. 3 shows an example of a single jog primitive 120 for simplicity in order to better characterize its features. The primitive has a center corner 125 in this case an interior corner or concave with an adjacent exterior or convex corner 123, 125 on either side. Each corner has two segments joined by a right angle. The segments are straight in the illustrated example and the angles are all right angles. For chromeless phase shift masks most segments are straight and most features are right angle features. However, the techniques described herein may be adapted to features that are not perfectly straight nor at right angles. If the features deviate significantly, then additional factors may be introduced to the calculations to accommodate those differences.

A nomenclature may be applied to the jog primitive so that a first outer corner 123 is labeled jog1, the center corner 125 is labeled corner, and the third corner, the second outer corner 127 is labeled jog2. Electric fields may be calculated for each corner using existing techniques by approximating the two sides of the corner as infinite straight lines. The electric field for jog1, $E_{jog1}$, is approximated as an electric field for a corner 123 of two infinite lines 121, 131 that meet at a right angle. Similarly the electric field for corner, $E_{corner}$, is approximated based on the right angle corner of two infinite lines 131, 133 and the electric field for jog2, $E_{jog2}$, is approximated using the right angle corner of the last two lines 133, 129 of the jog primitive.

Many rigorous methods exist to estimate a transmitted E-field. For example, in the Finite Difference Time Domain method, the Maxwell equations are replaced by a set of finite difference equations obtained by discretizing the Maxwell equations in space and time. This provides relationships between current states and the states of a subsequent time step. The E-field is then solved by stepping the solutions over time.

Another rigorous method, the Waveguide method, is a frequency domain method in which the simulation area is divided into 2D or 3D rectangular blocks. The material is considered uniform throughout each block so that the Maxwell equations can be solved analytically for each block. Solutions of all blocks are related by boundary conditions, which result in a set of linear algebraic questions that are then solved using matrix methods.

Having determined an E-field value for each of the three corners, the E-field for the jog primitive may be determined. To determine the electric field of the jog primitive these three E values can be combined as the sum of the fields of the two outer corners less the field of the center corner or:

$$E = E_{jog1} + E_{jog2} - E_{corner}.$$

This electric field, E, value may be used in a library to be applied for analyzing fields on a mask and performing any of a number of different corrections. However, for even higher accuracy, the E value may be corrected for the approximations in assuming that the corners had infinite lines. In the Equation, the electric field at the corner is corrected by a factor that includes the length of the longest side of the corner. The equation also modifies the correction factor for process parameters such as α, β and σ. The Equation below shows a more refined E calculation.

$$E = E_{jog1} + E_{jog2} - E_{corner}\left[\alpha - \frac{(1-\alpha)\left(1 - e^{-\frac{max(L_{jog1}, L_{jog2})}{\sigma}}\right)}{e^{-\frac{\beta}{\sigma}} - 1}\right] \quad \text{Equation}$$

In the Equation α, β and σ are process parameters that are determined empirically and vary for different photolithography equipment, chemistry, and mask geometries. $L_{jog1}$ and $L_{jog2}$ are the physical lengths as projected onto a surface of the straight segments 131, 133 on either side of the corner 125 of the jog primitive. Accordingly, the correction factor enclosed within brackets not only accommodates changes in process but also corrects for the actual size of the jog primitive.

A similar approach may be applied to other kinds of features by factoring the normally provided E-field with a factor that takes into account the dimensions of the primitive. The techniques above are not limited to the jogs shown in FIG. 3. The factor of the Equation includes distances from the center of a shape with one E-field to the center of a nearby shape with a different E-field. The factor may also incorporate the process parameters. In including both dimensional parameters and process parameters, the techniques described above, lend a higher level of precision to calculating E-fields than was previously available.

As can be seen from the equation the dimensions aspect of the factor is a negative exponent. As a result as the distance increases the resulting value decreases. This shows that the impact of nearby shapes decreases with distance. The E-field correction factor is therefore useful primarily for features that are nearby. The particular distance beyond which the factor is not useful will depend upon the precision desired, the size of the field and the process parameters.

Figure 4:
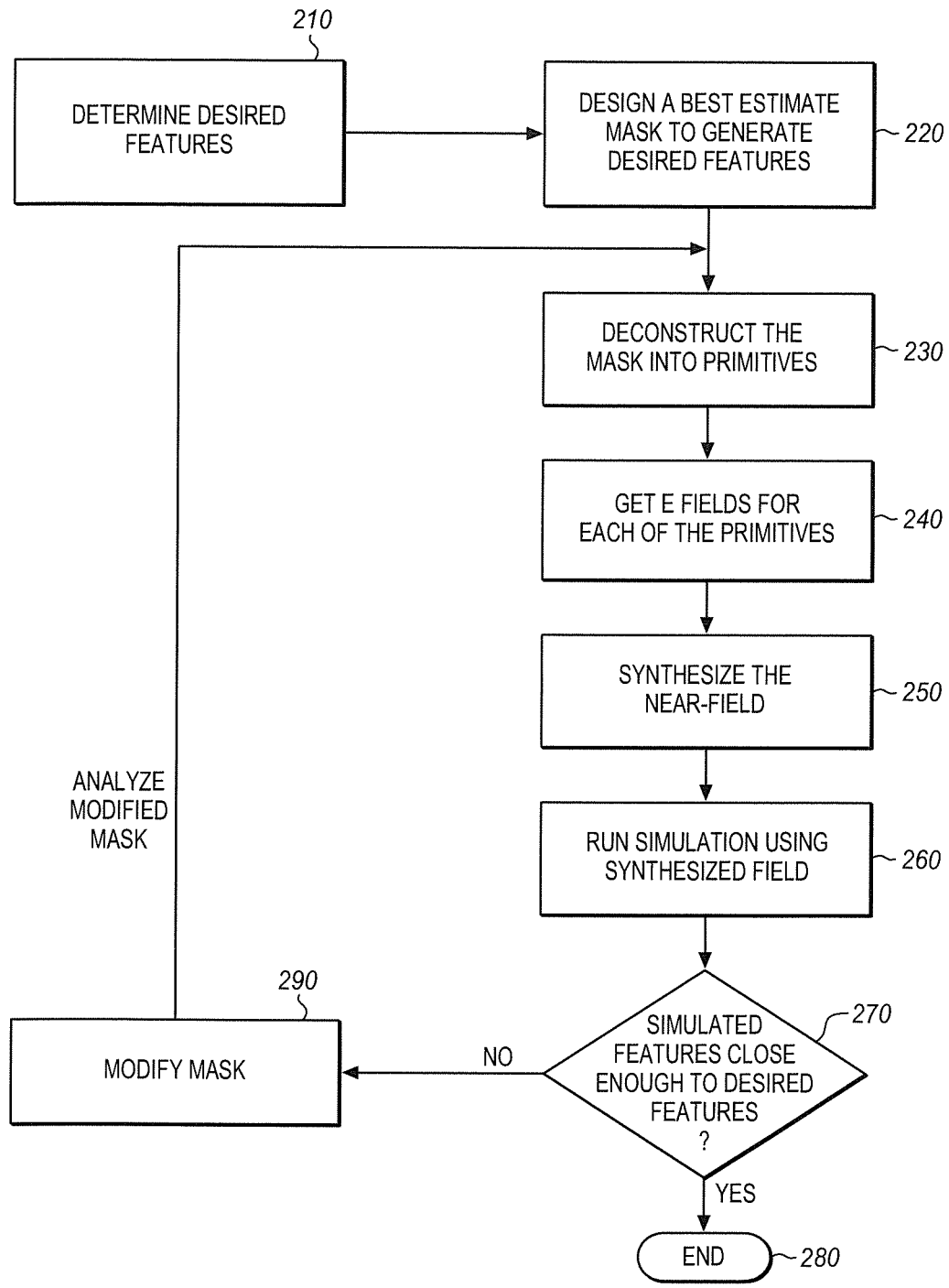
FIG. 4 is a modifying a photolithography mask design using E-fields according to an embodiment of the invention.

The determined E-fields for jog primitives may be applied to mask layout patterns using a process for photolithography simulation as shown in FIG. 4. At 210, a circuit design layout data is obtained. The desired features are identified and, based on these features, a best estimate mask may be designed at 220. This may be done in any of a variety of different ways depending upon the software tools available and the type of photolithography process that is being used. The mask typically has a combination of edges, corners, spaces, jogs, notches, and other shapes referred to as primitives and formed using reflective and transparent materials on a plate. For a chromeless phase shift mask, the materials on the mask have one of three values +1, 0 or −1. At 230, the mask is deconstructed into its primitives using any of a variety of different tools.

At 240, E-fields corresponding to the primitives are obtained. These may be pre-calculated E-fields or they may be retrieved from a library. The scattered fields may be calculated independently or for use in a library using rigorous simulations, prior empirical values and in other ways. For jog primitives, the approaches described above may be used. These fields are then combined at 250 to synthesize a scattered field that would be projected onto a photoresist layer of a substrate during actual photolithography.

At 260, a simulation may be conducted using the synthesized field to determine the features that would be generated by using the estimated mask from 220. The simulated features are compared to the original desired design features at 270 to determine whether the simulated features are sufficiently similar to the desired features that the mask should be used without further modification. If so, the process ends at 280. If not, the mask is modified at 290 to try to generate features that are closer to the desired features. The process then loops back to 230 to analyze the modified mask.

Figure 5:
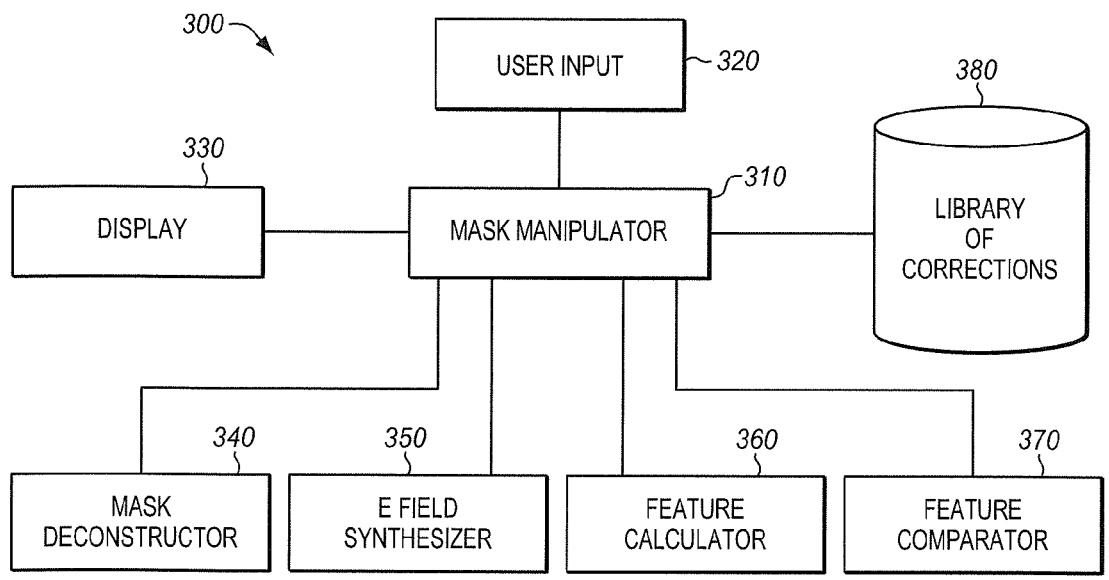
FIG. 5 is a block diagram of a system for modifying a mask design using E-fields according to an embodiment of the invention.

FIG. 5 is a block diagram of a system 300 for creating a mask according to an embodiment. A mask manipulator module 310 is coupled to a user input module 320, a display module 330, a mask deconstructor 340, an E-field synthesizer 350, a feature calculator 360, a feature comparator 370, and pre-calculated scattered fields. For many of the primitives, a library of E-fields for primitives 380 supplies appropriate E-field values.

An initial mask is input into the mask manipulator 310 and the mask deconstructor 340 deconstructs the mask into its primitives (e.g., edges, spaces, corners, jogs, etc.). The E-field synthesizer 350 looks up the E-field for each primitive in the library 380 of E-fields and also any pre-calculated E-fields for some primitives and then applies these to the E-field synthesizer. The resulting synthesized field corresponds to the field that would be generated on the photoresist during exposure.

The feature calculator 360 uses the synthesized field to determine the features that would result from the application of the mask. The feature comparator 370 then compares these features with the desired features. The mask manipulator 310 changes the mask to reduce the discrepancy between the desired features and the synthesized features, and the resulting new mask is analyzed in the same way as described above.

The display 330 may show the synthesized field as well as the results of the comparison done by the feature comparator 370. If any user input is required, it may be given using the user input module 320.

Figure 6:
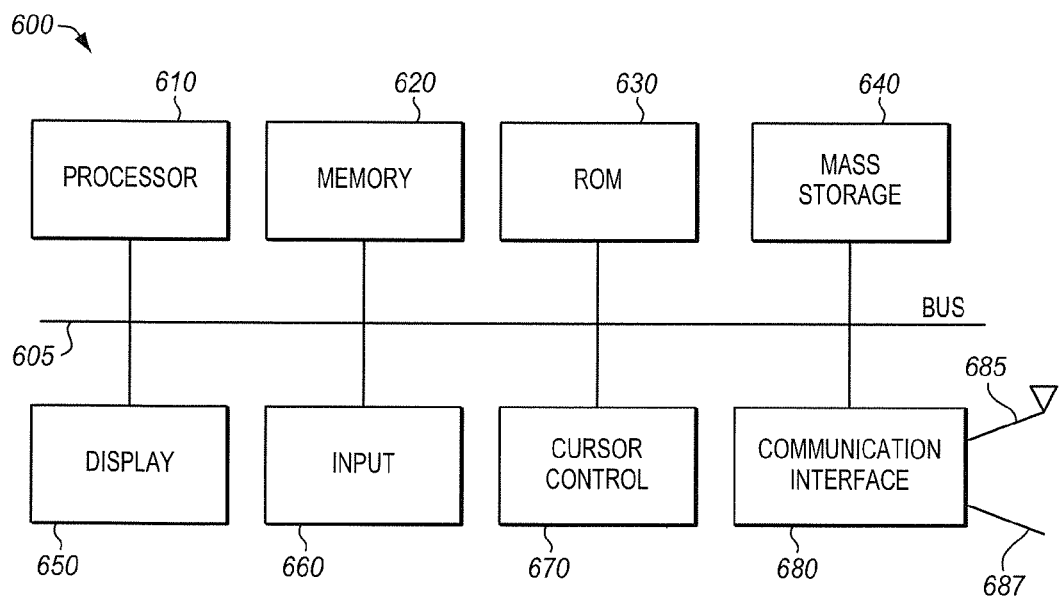
FIG. 6 is a block diagram of a computing system suitable for implementing embodiments of the invention.

FIG. 6 is a block diagram of one embodiment of an electronic system that may be used to implement the block diagram of FIG. 5. Alternative systems may include more, fewer, or different components. Systems such as that illustrated may be coupled together to provide multiple computing nodes.

Electronic system 600 includes a bus 605 or other communications device to communicate information, and a processor 610 coupled to the bus 605 to process information. While the electronic system 600 is illustrated with a single processor, the electronic system 600 may include multiple processors or co-processors. The electronic system 600 further includes a random access memory (RAM) or other dynamic storage device 620 (referred to as memory), coupled to the bus 605 to store information and instructions to be executed by the processor 610. The memory 620 also may be used to store temporary variables or other intermediate information during execution of instructions by the processor 610.

The electronic system 600 also includes a read only memory (ROM) and/or other static storage device 630 coupled to bus 605 to store static information and instructions for the processor 610. A data storage device 640 is coupled to the bus 605 to store information and instructions.

The electronic system 600 may also be coupled via the bus 605 to a display device 650, such as a light emitting diode (LED) or liquid crystal display (LCD), to display information to a user. An input device 660, including alphanumeric and other keys, is typically coupled to the bus 605 to communicate information and command selections to the processor 610. Another type of user input device is a cursor control 670, such as a mouse, a trackball, or cursor direction keys to communicate direction information and command selections to the processor 610 and to control cursor movement on a display 650. The electronic system 600 further includes a network interface 680, such as a wired network interface 687 or a wireless network interface 685 to provide access to a network, such as a local area network.

Instructions are provided to memory from a storage device, such as magnetic disk, a read-only memory (ROM) integrated circuit, CD-ROM, DVD, via a remote connection (e.g., over a wired or wireless network via the network interface) providing access to one or more electronically-accessible media, etc. In alternative embodiments, hard-wired circuitry may be used in place of or in combination with software instructions. Thus, execution of sequences of instructions is not limited to any specific combination of hardware circuitry and software instructions.

A computer-readable medium includes any mechanism that provides (i.e., stores and/or transmits) content (e.g., computer executable instructions) in a form readable by an electronic device (e.g., a computer, a personal digital assistant, a cellular telephone). For example, a computer-readable medium may include read only memory (ROM); random access memory (RAM), magnetic disk storage media; optical storage media; or flash memory devices, etc.

Methods and apparatuses are described herein with respect to integrated circuit manufacturing; however, the techniques described may be applied to the manufacturing and/or design process of any integrated device. Integrated devices include integrated circuits, micromachines, thin film structures such as disk drive heads, gene chips, micro-electromechanical systems (MEMS), or any other article of manufacture that is manufactured using lithography techniques.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

The above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A computer-implemented method comprising:
   decomposing at least a portion of a mask layout of a photolithography mask into primitives:
   identifying jogs from among the primitives, the identified jogs being characterized by three adjacent corners;
   determining electric fields for the identified jogs;
   applying the determined electric fields to synthesize an electric field at a substrate;
   correcting the mask layout using the synthesized electric field; and
   calculating a printed wafer pattern using the corrected mask layout.

2. The method of claim 1, wherein the three adjacent corners alternate in orientation.

3. The method of claim 1, wherein the determining the electric fields comprises determining an electric for each of the three adjacent corners of the identified jogs and subtracting the field of a center corner of each of the three adjacent corners of the identified jogs from a sum of the other two corners of each of the identified jogs to obtain a total electric field.

4. The method of claim 3, further comprising factoring the total electric field by parameters including a physical dimension of the identified jogs.

5. The method of claim 4, wherein the physical dimension includes a physical distance from the center corner to at least one of the other two corners.

6. The method of claim 4, wherein the parameters include a physical distance from the center corner to each of the other two corners.

7. The method of claim 5, further comprising factoring the total electric field by a factor that includes an exponential function in which its exponent includes a greater one of the physical distance from the center corner to one of the two corners and the physical distance from the center corner to another one of the other two corners.

8. The method of claim 1, further comprising determining electric fields for other primitives using pre-calculated electric field values and wherein the applying the determined electric fields further comprises applying the determined electric fields for the other primitives.

9. A non-transitory computer-readable medium having instructions that, when executed by the computer, cause the computer to perform operations comprising:
decomposing at least a portion of a mask layout of a photolithography mask into primitives;
identifying jogs from among the primitives, the identified jogs being characterized by three adjacent corners;
determining electric fields for the identified jogs;
applying the determined electric fields to synthesize an electric field at a substrate;
correcting the mask layout using the synthesized electric field; and
calculating a printed wafer pattern using the corrected mask layout.

10. The medium of claim 9, wherein the determining the electric fields comprises determining an electric for each of the three adjacent corners of the identified jogs and subtracting the field of a center corner of each of the three adjacent corners of the identified jogs from a sum of the other two corners of each of the identified jogs to obtain a total electric field.

11. The medium of claim 10, further comprising factoring the total electric field by parameters including a physical dimension of the identified jogs.

12. A phase shift photolithography mask determined by:
decomposing at least a portion of a mask layout of a photolithography mask into primitives;
identifying jogs from among the primitives, the identified jogs being characterized by three adjacent corners;
determining electric fields for the identified jogs;
applying the determined electric fields to synthesize an electric field at a substrate;
correcting the mask layout using the synthesized electric field; and
calculating a printed wafer pattern using the corrected mask layout.

13. The mask of claim 12, wherein the three adjacent corners alternate in orientation.

14. The mask of claim 12, wherein the determining electric fields for the identified jogs comprises factoring the electric field for a one of the identified jogs by a factor that includes an exponential function in which its exponent includes a greater of a physical distance from a center corner to one of the other two corners and a physical distance from the center corner to another one of the other two corners.

15. The mask of claim 14, wherein the exponent further includes a coherence factor of an illumination source to be applied to the mask.

16. A computer-implemented method comprising:
decomposing at least a portion of a mask layout of as photolithography mask into primitives;
identifying types of primitives from among the primitives;
determining electric fields for a specific type of primitive by a factor;
factoring the determined electric field for the specific type of primitive, the factor including a physical dimension related to the specific type of primitive;
applying the determined electric fields to synthesize an electric field at a substrate;
correcting the mask layout using the synthesized electric field; and
calculating a printed wafer pattern using the corrected mask layout.

17. The method of claim 16, wherein the specific type of primitive comprises a jog, a jog being characterized by three adjacent corners.

18. The method of claim 16, wherein the physical dimension comprises a distance to a nearby primitive.

19. The method of claim 18, wherein the physical dimension is applied as a negative exponent that is a component of a numerator of the factor.

20. The method of claim 16, further comprising determining electric fields for other primitives using electric field values from a library and wherein the applying the determined electric fields further comprises applying electric fields for the other primitives.

* * * * *